United States Patent [19]
Assaderaghi et al.

[11] Patent Number: 5,998,847
[45] Date of Patent: Dec. 7, 1999

[54] LOW VOLTAGE ACTIVE BODY SEMICONDUCTOR DEVICE

[75] Inventors: Fariborz Assaderaghi, Mahopac, N.Y.; Claude L. Bertin, South Burlington, Vt.; Jeffrey P. Gambino, Gaylordsville, Conn.; Louis Lu-Chen Hsu, Fishkill; Jack Allan Mandelman, Stormville, both of N.Y.

[73] Assignee: International Business Machines Corporation, Armonk, N.Y.

[21] Appl. No.: 09/132,599

[22] Filed: Aug. 11, 1998

[51] Int. Cl.⁶ .................................................. H01L 29/784
[52] U.S. Cl. ......................... 257/401; 257/217; 257/392; 257/403; 257/900
[58] Field of Search .................................. 257/192, 217, 257/377, 387, 391, 413, 508, 900, 392, 393, 394, 403, 401

[56] References Cited

U.S. PATENT DOCUMENTS

| | | | |
|---|---|---|---|
| 5,120,666 | 6/1992 | Gotou | 437/40 |
| 5,298,443 | 3/1994 | Jang | 437/40 |
| 5,714,393 | 2/1998 | Wild et al. | 437/15 |
| 5,834,816 | 11/1998 | Jang | 257/382 |
| 5,852,319 | 12/1998 | Chikamatsu et al. | 257/390 |

FOREIGN PATENT DOCUMENTS

| | | | |
|---|---|---|---|
| 362093971 | 4/1987 | Japan | 257/401 |
| 405343669 | 12/1993 | Japan | 257/401 |

OTHER PUBLICATIONS

Mandelman et al, Floating–Body Concerns for SOI Dynamic Random Access Memory (DRAM), *Proceedings 1996 IEEE International SOI Conference*, Oct. 1996: 136–137.

*Primary Examiner*—Donald L. Monin, Jr.
*Assistant Examiner*—Michael Dietrich
*Attorney, Agent, or Firm*—Pollock, Vande Sande & Amernick; Eugene I. Shkurko

[57] ABSTRACT

An active FET body device which comprises an active FET region including a gate, a body region and electrical connection between said gate and said body region that is located within the active FET region is provided along with various methods for fabricating the devices. The electrical connection extends over substantially the entire width of the FET.

8 Claims, 12 Drawing Sheets

LOW VOLTAGE ACTIVE BODY SEMICONDUCTOR DEVICE

TECHNICAL FIELD

The present invention is concerned with an active field effect transistor (FET) body device and is particularly concerned with an active body semiconductor device exhibiting low threshold operating voltage along with high threshold voltage in the off-condition. The devices of the present invention exhibit low off-current and high on-current, making them suitable for extremely low voltage applications. In addition, the present invention is concerned with methods for fabricating such active body devices.

BACKGROUND OF INVENTION

As operating voltages are reduced for semiconductor devices, the amount of gate overdrive ($V_{gs}-V_t$) decreases because $V_t$ must be maintained sufficiently high to meet the off-current requirements imposed by the desired standby power for the device. For example, by way of illustration, reducing the operating voltages makes it increasingly difficult to write a usable signal into a dynamic random access memory (DRAM) storage capacitor because of the non-scalability of threshold voltage, due to the limiting affects of sub-threshold slope and substrate sensitivity. For a given temperature, sub-threshold slope is limited by the physics of carrier transport over the source-channel potential barrier. Given a required I off, sub-threshold slope determines $V_t$. Thus minimum $V_t$ is constrained or restricted.

Due to the non-scalability of $V_t$, to meet the device off-current objective, the percentage that the word line must be boosted above the power supply is greater than it was for earlier generations. Accordingly, the minimum gate oxide thickness is constrained by reliability considerations. Using thicker than desired gate oxide layers results in device performance penalties for the array device, as well as for the support devices.

More recently, SOI structures had been suggested for low-voltage DRAM applications because of improved sub-threshold slope and reduced back bias sensitivity. In particular, by simultaneously driving the gate and body of a SOI device, dynamic $V_t$ operation can be maintained. In other words, as the gate voltage is ramped up, the back bias on the MOSFET decreases, resulting in a lowering of the threshold voltage. Thus, relatively high current drive may be obtained in combination with low off-current. However, prior art suggestions of body-driven dynamic $V_t$ MOSFETs has been achieved by bringing the body to gate contact out adjacent to the active device, which results in using valuable substrate real estate. Furthermore, floating body leakage mechanisms present a very serious challenge to achieving the desired data retention time. In particular, see Mandelman et al, "Floating-Body Concerns for SOI Dynamic Random Access Memory (DRAM)", IEEE SOI Conference Proceedings, 1996, pp. 136–137.

It would therefore be desirable to provide a low $V_t$ during write back while meeting the off-current objective for a device along with overcoming the leakage problems associated with prior SOI devices.

SUMMARY OF INVENTION

The present invention provides an active FET body device and process for fabricating it which eliminates detrimental floating-body effects as discussed above. The present invention achieves rapid charge equilibration, significant off-current reduction and significant on-current enhancement. More particularly, the present invention provides an active FET body device comprising electrical connection between the gate and the body located within the active field effect transistor region.

The gate to body contact according to the present invention extends over the entire width, or at least substantially the entire width, of the FET. This structure according to the present invention results in low voltage drop across the width of the device. The body contact across the entire width assures that rapid and efficient equilibration of body charge occurs with the gate. In prior art designs which bring the body contact out adjacent to the device, rapid and efficient body charge equilibration is possible only for devices whose channel width does not greatly exceed the minimum lithographically definable dimension. In the present invention there is no restriction on device width. This allows wide devices to be used, which improves performance. The channel width is defined as the device dimension normal to channel current.

The present invention provides an active FET body device which comprises an active FET region including a gate; a body region and electrical connection between the gate and body region located within the active field effect transistor region. Preferably, the length of the gate to body contact along the surface of semiconductor substrate is equal to or less than about 200 Å.

In addition, the present invention relates to processes for fabricating the above-disclosed active FET body device. In particular, according to one embodiment of fabricating the device of the present invention, a structure comprising a semiconductor substrate, active device regions and isolation regions is provided. An insulating pad structure is provided on the semiconductor substrate. Openings are defined in the pad structure down to the substrate for determining the shape of the subsequent gate contact. A sacrificial oxide layer is provided and dopants are implanted for adjusting the threshold voltage, $V_t$. The sacrificial oxide layer is removed and a gate insulator layer is formed. A doped polysilicon layer is deposited and then etched to provide spacers on the sidewalls of the openings in the isolating pad structure. A conformal layer is deposited. The conformal layer is a conductive diffusion barrier material, a doped amorphous silicon or a doped polysilicon. A metallic silicide is deposited or when the conformal layer is doped amorphous silicon or doped polysilicon, a silicide forming metal is deposited and reacted to form a silicide. The metallic silicide is planarized to the top of the isolation pad structure. In addition, the metallic silicide fills the cavity bounded by the conformal layer. The portions of the doped polysilicon, conductive diffusion barrier material and metallic silicide that are unprotected by the isolation pad are etched. The isolation pad is removed and source and drain regions are implanted.

In an alternative embodiment for fabricating the active FET body device of the present invention, a structure comprising a semiconductor substrate, active device regions and isolation regions is provided. An insulating pad is provided on the substrate. An insulating layer is provided on top of the insulating pad structure. The insulating layer differs from the material of the pad structure that it contacts. Openings are defined in the pad structure down to the substrate for determining the shape of the subsequent gate contact. A sacrificial oxide layer is provided and dopants are implanted for adjusting the threshold voltage, V$t$. A portion of the sidewalls of the insulating pad structure is etched so that the insulating layer overhangs the pad structure. The sacrificial oxide layer is removed and a gate insulator layer is formed. An undoped polysilicon layer is deposited filling the openings in the insulating pad structure and creating a void in the polysilicon. The polysilicon is planarized and polished, rendering it coplanar with the insulating pad structure, and exposing the void in the undoped polysilicon. The gate insulator located at the bottom of the void is removed, thereby exposing the top surface of the substrate. A layer of a silicide forming metal is deposited over the structure including filling the gap or void. Metal that is in contact with the undoped polysilicon is reacted with it to form a metallic silicide over polysilicon regions. Unreacted silicide forming metal is selectively removed. The polysilicon is doped to form the gate conductor. Source and drain regions are also created.

According to a still further embodiment according to the present invention, for fabricating an active FET body device as disclosed above, a structure comprising a semiconductor substrate, active device regions and isolation regions is provided. An insulating pad structure is provided on the substrate. An insulating layer is provided on top of the pad structure. The insulating layer differs from the material of the pad structure that it contacts. Openings are defined in the insulating layer and pad structure down to the substrate for determining the shape of the subsequent gate contact. A sacrificial oxide layer is provided. Dopants are implanted for adjusting $V_t$. A portion of the sidewalls of the insulating pad structure is etched so that the insulating layer overhangs the pad structure. The sacrificial oxide layer is removed and a gate oxide layer is formed. A first polysilicon layer doped with impurities of a first type is deposited, filling the openings in the insulating pad structure and creating a void in the polysilicon layer. The polysilicon is planarized and polished, rendering it coplanar with the insulating pad structure and exposing the void. The gate oxide located at the bottom of the void is removed thereby exposing the top surface of the substrate. A second thin layer of polysilicon lightly doped with impurities of a second type different from the first type is deposited. The doping of the second type is preferably of the same type as that of the semiconductor substrate. A third layer of polysilicon doped with impurities of a second type different from the first type having a dosage greater than that of the second polysilicon layer is deposited. The polysilicon is planarized and polished rendering it coplanar with the insulating pad structure, and is then recessed beneath the level of the insulating pad structure. A layer of a silicide forming metal is deposited over the structure. Metal that is in contact with polysilicon is reacted with it to form a metal silicide over polysilicon regions. Unreacted silicide forming metal is selectively removed. Source and drain regions are formed.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures which illustrate a diagrammatic representation of the steps of various embodiments according to the present invention. Like numerals in different figures refer to the same component.

It is to be understood that when the discussion refers to n-type impurities, the particular steps are applicable to p-type impurities, and vice versa. Also, although the process described concerning employing as the substrate a silicon on insulator (SOI) structure, the present invention is applicable to other semiconductor substrates for achieving active body devices. In addition, when reference is made to impurities of a "first type" and to impurities of a "second type", it is understood that the "first type" refers to n- or p-type impurities and "second type" refers to the opposite conductivity type. That is, if the "first type" is p, then the "second type" is n. If the "first type" is n, then the "second type" is p. P-type dopants for silicon and polysilicon include boron, aluminum, gallium and indium. N-type dopants for silicon and polysilicon include arsenic, phosphorous and antimony. Also, by way of illustration and to facilitate an understanding of the present invention, the fabricating sequencing will refer to providing a dynamic random access memory (DRAM) SOI MOSFET, a logic device or high performance driver device.

Figure 1:
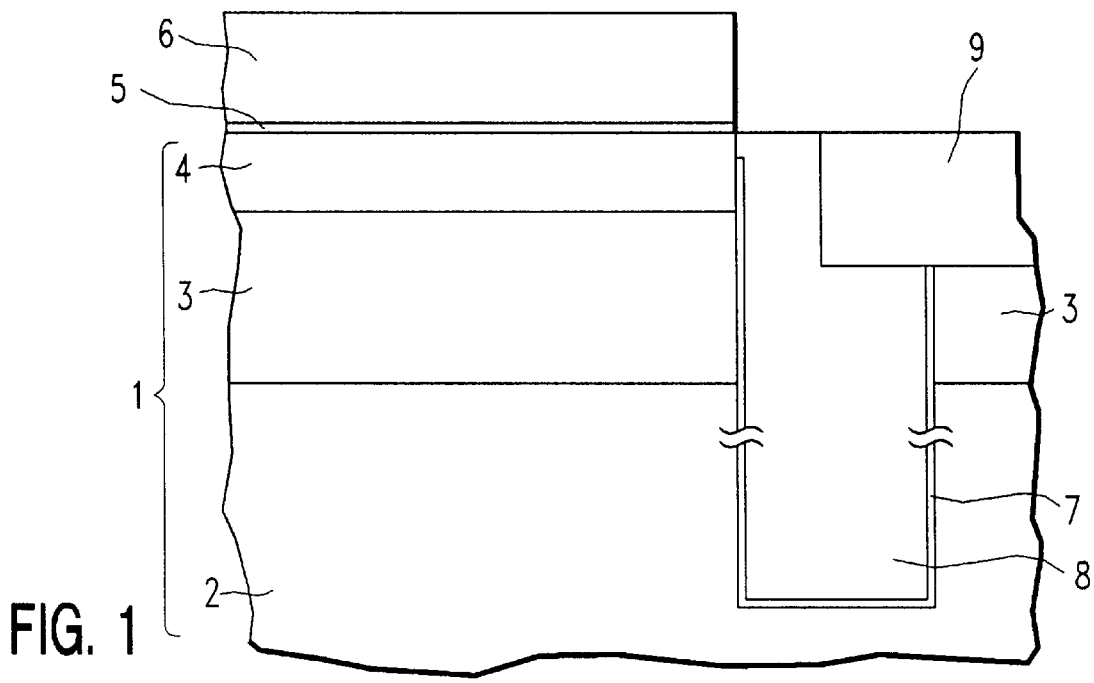
FIGS. 1–6 are schematic diagrams of the structure in various stages of the processing according to an embodiment of the present invention.

In particular, according to an embodiment of the present invention (see FIG. 1), which is most useful for fabricating DRAMs, a SOI substrate 1 comprising a silicon substrate 2, a back silicon dioxide layer 3 and a top single crystal silicon film 4. The SOI (silicon on insulator) substrates (starting wafers) can be purchased from silicon wafer manufacturers and are typically manufactured using any one of several well known methods, including SIMOX (silicon implanted with oxygen - most popular), Bond-and-Etchback, or SMART-CUT®. Typically, the back oxide layer 3 is about 500 to about 5000 Å thick and more typically about 1000 to about 3000 Å thick. Monocrystalline silicon layer 4 is provided on the silicon dioxide layer 3. This layer 4 is typically about 250 to about 3000 Å thick and more typically about 750 to about 2000 Å thick. A pad structure comprising a thin layer of silicon dioxide and a thicker layer of silicon nitride is provided. The silicon dioxide layer is typically about 40 to about 150 Å thick and more typically about 50 to about 80 Å thick. This layer can be formed by chemical vapor deposition or thermal oxidation of the underlying silicon layer 4. The silicon nitride layer is typically about 500 to about 4000 Å thick. The silicon nitride layer can be formed by CVD including thermal and plasma-enhanced CVD.

Deep storage trenches can be formed by etching through selective portion of silicon nitride layer, silicon dioxide layer, silicon layer 4, back oxide layer 3 and into silicon substrate 2 down to about 4 to about 8 microns, example of which being 6 microns.

The trench is insulated with dielectric layer 7 such as composite silicon nitride/silicon dioxide. A conductive material 8 such as doped polysilicon can be used to fill the trench, followed by being planarized to the top of silicon nitride pad. The polysilicon 8 in the trench is then recessed and the exposed trench insulator 7 is removed typically to bottom of silicon layer 4. Doped polysilicon is again deposited in the trench and planarized down to the silicon nitride layer. This polysilicon will provide connection of subsequent array MOSFET to storage capacitor. In addition, active areas bounded by shallow trench isolation (STI) 9 can be defined by etching an opening or trench in silicon nitride layer, then through silicon dioxide layer, silicon layer 4 and into back oxide 3. The opening is then filled with insulating material such as silicon dioxide formed by CVD of tetraethylorthosilicate (TEOS), followed by planarizing. The silicon dioxide in the STI can be recessed selective to the silicon nitride. The pad structure of the silicon nitride and silicon dioxide is removed.

A new pad structure is formed. This pad structure comprises a thin layer 5 of silicon dioxide and a thicker layer 6 of silicon nitride. The silicon dioxide layer 5 is typically about 40 to about 150 Å thick and more typically about 50 to about 80 Å thick. Layer 5 can be formed by chemical vapor deposition or thermal oxidation of the underlying silicon layer 4.

The silicon nitride layer 6 is typically about 500 to about 4000 Å thick and more typically about 1000 to about 3000 Å thick. Layer 6 can be formed by CVD including thermal and plasma enhanced CVD.

Figure 2:
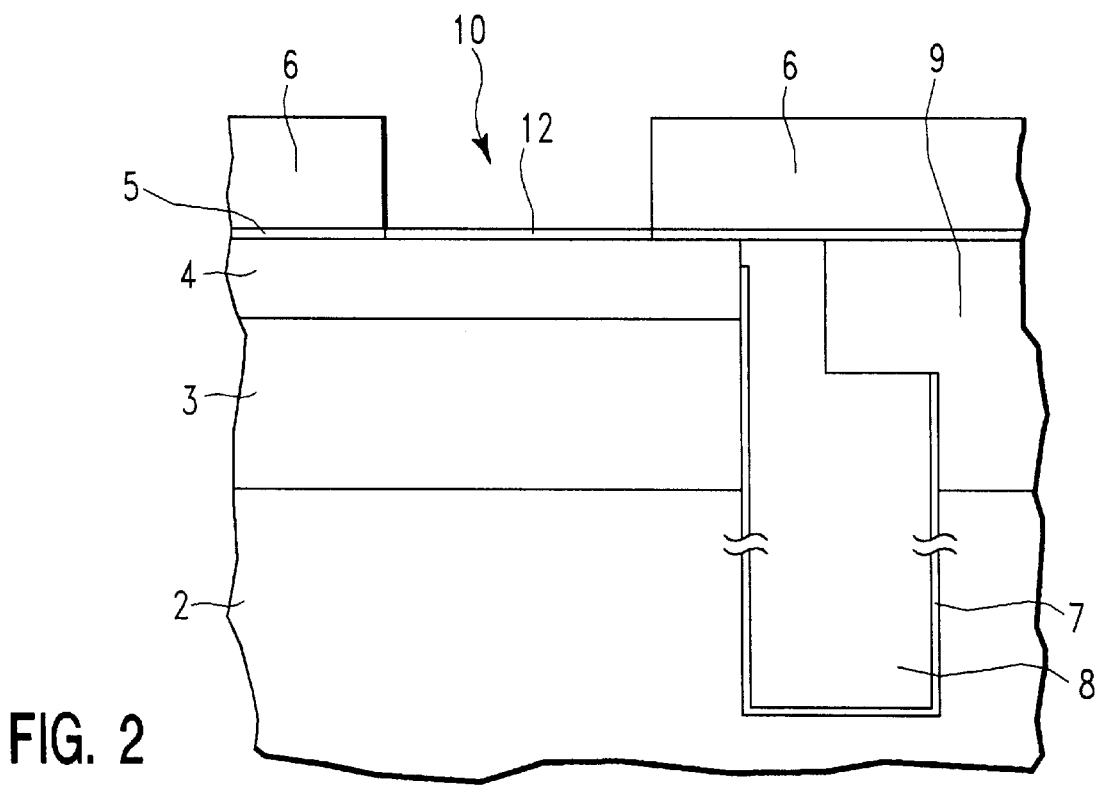

As illustrated in FIG. 2, openings 10 are defined in the silicon nitride pad layer 6 using known lithographic procedures followed by selective etching of layer 6 using reactive ion etching (RIE), for example. The exposed portion of layer 5 is then etched using a fluorine based chemistry, for instance. A sacrificial oxide layer (not shown) is grown in the opening created in the silicon nitride pad 6. Next, threshold voltage, $V_t$ tailor implants are provided through the sacrificial oxide layer.

The sacrificial oxide layer is removed with a buffered HF wet etch or chemical downstream etch (CDE) containing fluorine chemistry. A gate insulator layer 12 such as an oxide layer is then formed by thermal oxidation of the underlying silicon layer 4. A nitride oxide layer may also be used. The gate insulating layer 12 is typically about 25 to about 100 Å thick.

Figure 3:
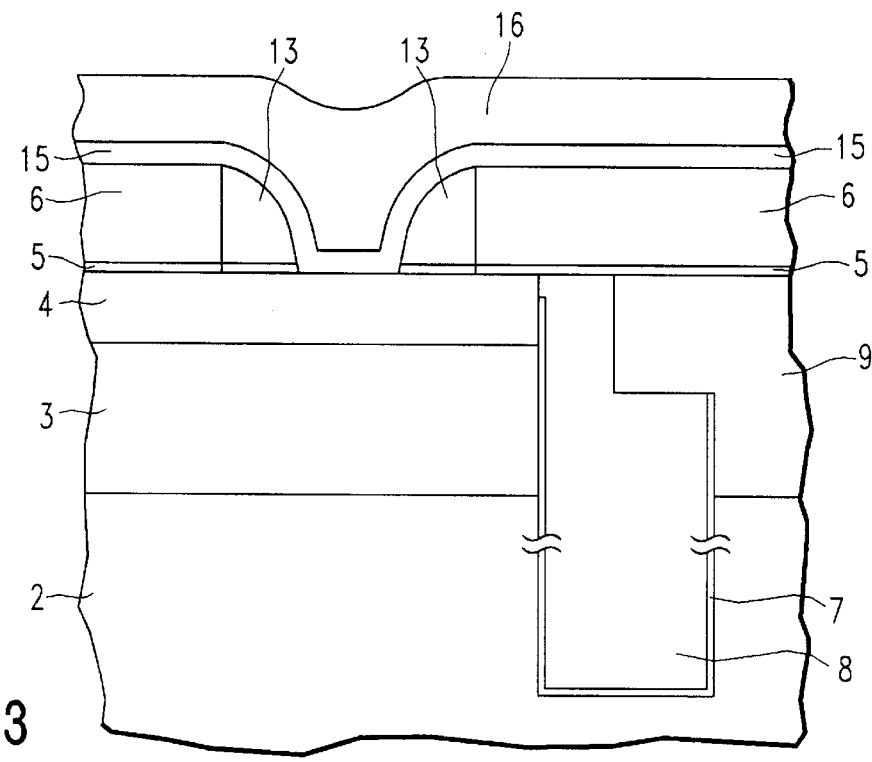

A first polysilicon layer doped with a dopant of a first type such as a N+ doped polysilicon layer is deposited (see FIG. 3). The polysilicon layer is then exposed to reactive ion etching (RIE) to form spacers 13 on the sidewalls of the openings in the silicon nitride pad layer 6. An example of a suitable RIE process is described by Wolf et al, Silicon Processing for the VLSI Era, Vol. 1, Process Technology, Lattice Press, pp. 539–585, disclosure of which is incorporated herein by reference. The exposed portion of the gate insulating layer 12 is then removed by etching. A thin conformal layer 15 of a conductive diffusion barrier material such as titanium nitride or tantalum silicon nitride is deposited. The barrier layer is typically about 50 to about 1000 Å thick and more typically about 100 to about 300 Å thick.

A metallic silicide layer 16 is deposited and is planarized to the top of the silicon nitride pad 6. Examples of suitable metallic silicide layers include titanium silicide, molybdenum silicide, zirconium silicide, hafnium silicide, vanadium silicide, niobium silicide, tantalum silicide, chromium silicide, and tungsten silicide. Such can be formed by sputtering such as from a solid silicide target. The layers 15 and 16 are planarized to the top of silicon nitride layer 6. The top surface of silicide layer 16 can be recessed below the surface of the nitride pad 6.

In an alternative embodiment, layer 16 may be polysilicon or amorphous silicon doped with an impurity of the second type. After depositing the doped polysilicon or amorphous silicon layer 16, layer 15 and layer 16 are planarized to the top surface of the pad nitride 6. Then a silicide forming metal layer is deposited over the structure.

Examples of suitable silicide forming metals include titanium, molybdenum, zirconium, hafnium, vanadium, niobium, tantalum, chromium and tungsten with titanium and tungsten being preferred. The metal is then reacted with the polysilicon or amorphous silicon with which it contacts to form a metallic silicide 16 over the polysilicon or amorphous silicon. In the case of titanium, such can be reacted in an inert ambient such as argon.

The unreacted metal can be removed using an etchant selective to the metal silicide. For example, in the case of titanium it can be removed using techniques well known in the art such as a combination of sulfuric acid and hydrogen peroxide.

The top surface of layers 13, 15 and 16 (gate conductor) is then recessed below the top surface of the nitride pad by about 100 to about 500 Å.

Figure 4:
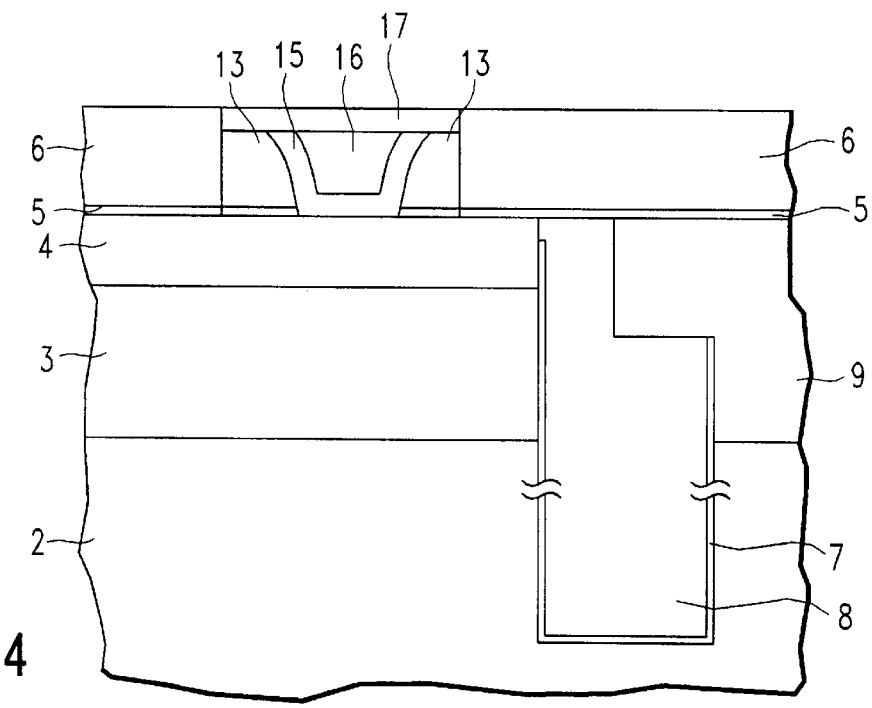

A layer 17 of CVD silicon dioxide is deposited, followed by planarizing and polishing to the top of the silicon nitride pad 6. This forms an oxide insulating cap over the gate conductor as illustrated in FIG. 4.

Figure 5:
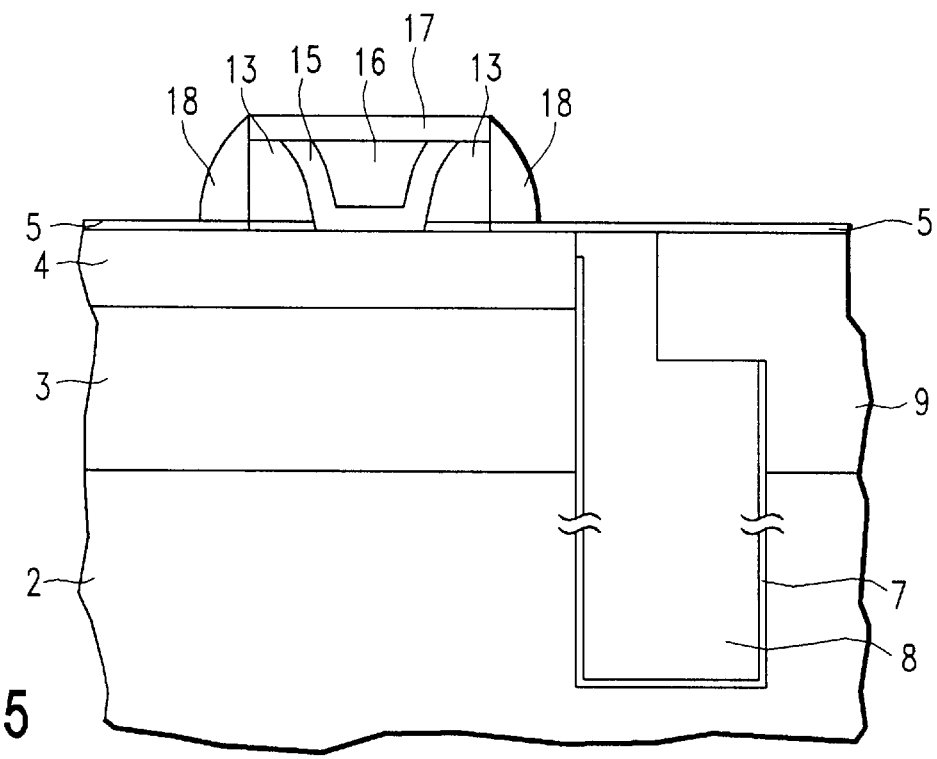

The silicon nitride pad layer 6 is removed such as by using a hot phosphoric acid etch. The pad oxide layer 5 remains and serves as the screen oxide for the source-drain implants. Insulating sidewall spacers 18 are formed on the word lines as illustrated in FIG. 5.

A thin silicon oxide layer 19 (see FIG. 6) is deposited such as by CVD followed by opening windows 20 in it to expose underlying diffusion for bitline contact.

Doped polysilicon 21 containing dopant of the first type is deposited. A masking step is provided to trim the edge of polysilicon 21 creating a borderless contact to bit line diffusion.

Next, conventional processing is conducted including forming contact studs and defining various wiring levels.

The structure provided includes both a N+ gate and a P+ gate whereby the P+ gate contacts the monocrystalline silicon of the SOI while the N+ gate is isolated from it.

Figure 6:
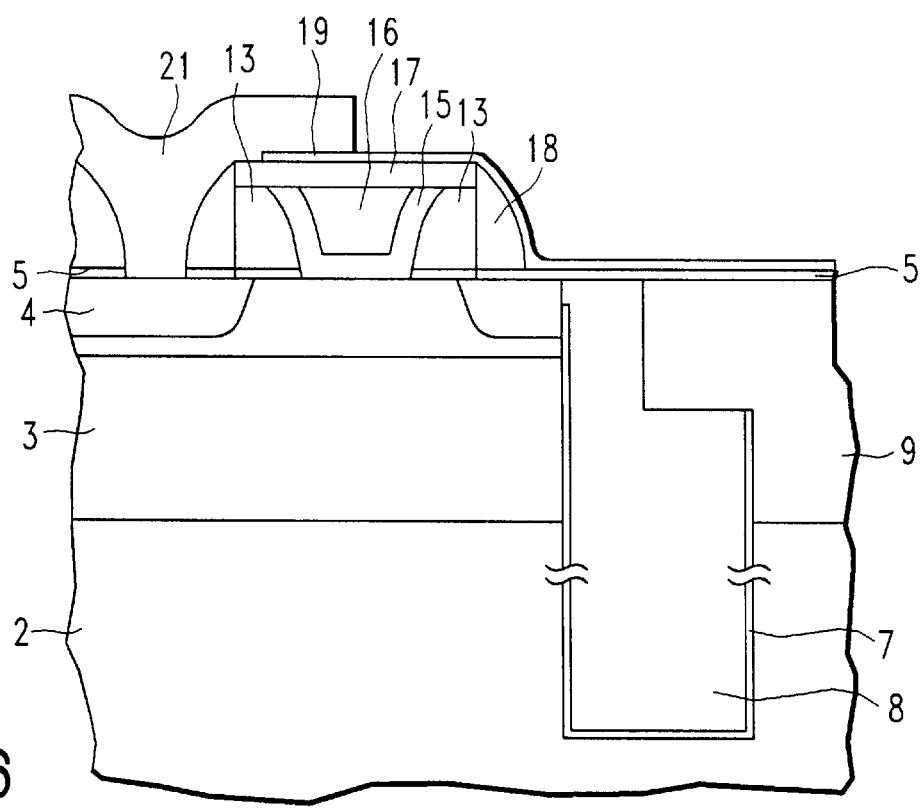

In the off-condition, the gate contact to the body of the configuration illustrated in FIG. 6 holds the body at the word line low level (which may be 0.0 or some negative value). In this condition, the threshold voltage has its largest value. As the word line is ramped in the positive direction, the body to source potential is raised, in addition to the voltage applied to the N+ portion of the gate conductor. This results in a lowering of the $V_t$ (and steeper sub-threshold slope) as the device is turned on.

Figure 7:
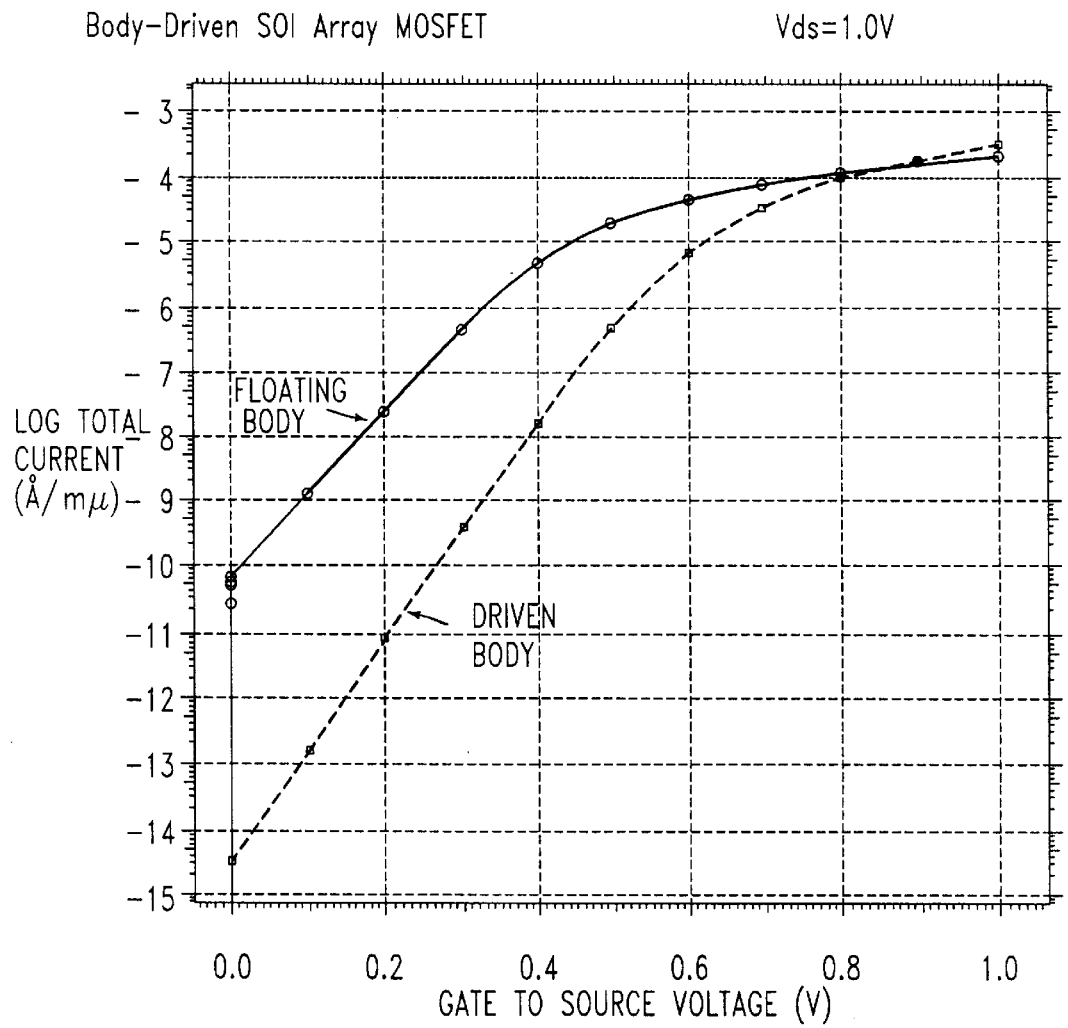
FIG. 7 is a graph simulating $I_d$–$V_g$ characteristics of a device prepared according to the sequence illustrated in FIGS. 1–6 to a standard device having floating body.
Figure 8:
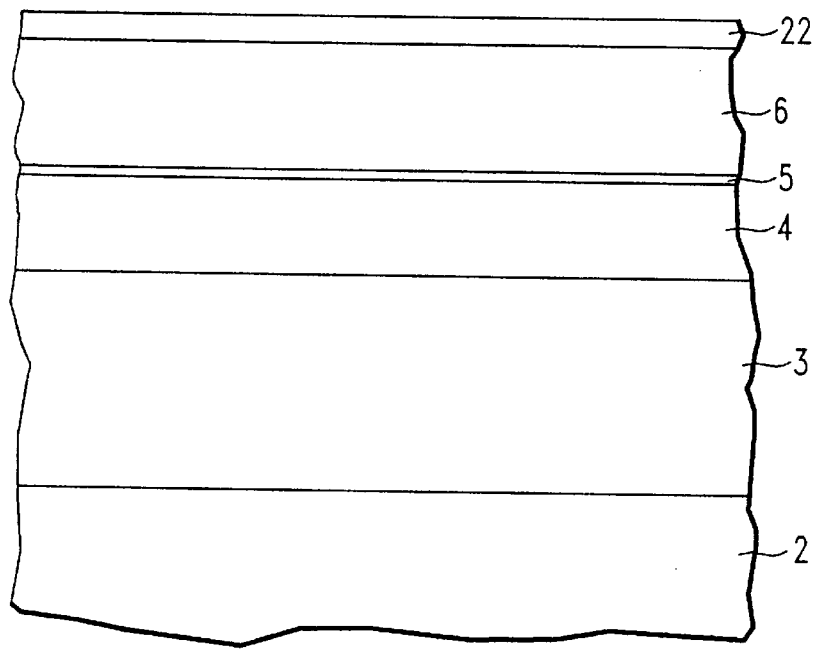
FIGS. 8–15 are schematic diagrams of a structure in various stages of an alternative process according to the present invention.
Figure 9:
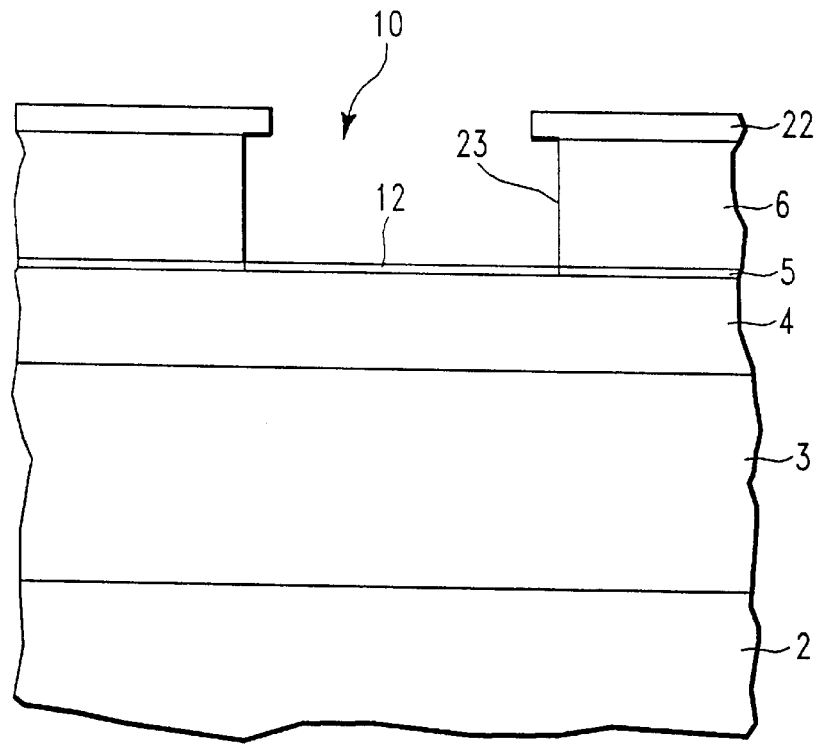

Simulated $I_d$–$V_g$ characteristics of this device are compared to a standard SOI MOSFET, having floating body, in FIG. 7. Please observe the large reduction in off-current, improvement in sub-threshold slope and increased on-current relative to the standard device. The off-current is reduced by a factor of >1E4, while the on-current is 40% larger for the body driven device. Although the sub-threshold slope is a respectable 80 mV/dec at 25° C. for the floating body device, it falls to 60 mV/dec for the body driven device.

As the gate voltage is ramped up, the MOS gated side of the channel closest to the source inverts first. This results in a dynamic narrowing of the pseudo base width, in addition to the dynamic lowering of $V_t$ described above. The inversion layer on the MOS gated side closest to the source behaves as an extension to the pseudo emitter (source) which results in increasing bipolar gain with increasing gate voltage. This dynamic bipolar gain effect associated with the structure of the present invention provides a unique result. The dynamic $V_t$ lowering effect along with the low off-current of the devices of the present invention make it suitable for extremely low voltage applications such as 0.7 volts. Accordingly, performance advantages over conventional MOSFETs is substantial.

The alternative embodiments according to the present invention shown in FIGS. 8–15 and FIGS. 16–23 provide for self-alignment of the contact between the gate and body with respect to other features of the device such as the gate edges. In addition, the preferred techniques form a contact whose geometry is highly reproducible and independent of the gate length. The size of the gate to body contact achieved can be significantly smaller than what is definable by normal photolithographic processes. As discussed above, preferably the length of the gate to body contact along the surface of the semiconductor substrate is equal to or less than about 200 Å, and most preferably the length of the gate to body contact is equal to or less than about 100 Å.

Contact lengths greater than 200 Å are not preferred since such lengths tend to result in an excessive fraction of the source current being diverted into the gate, thus degrading the gain of the device. According to an alternative fabricating process of the present invention, a standard SOI substrate 1, active regions and isolation regions as discussed above for the process defined in FIGS. 1–6 is provided by well known customary techniques.

The original pad layer employed which is used for defining the active regions is removed and new pad layer structure is formed. This new pad layer structure comprises a thin thermally grown silicon oxide layer 22 is deposited such as by chemical vapor deposition on the silicon nitride layer 6. See FIG. 8. Openings 10 through this silicon oxide layer 22 and pad structure including the silicon nitride layer 6 and thin pad silicon oxide layer 5 are provided such as by etching using reactive ion etching (RIE) down to the underlying monocrystalline silicon layer 4. These openings 10 determine the shape of the subsequently to be formed gate contact wiring level.

A sacrificial oxide layer (not shown) is then grown in the opening 10 such as by thermal oxidation of the underlying monocrystalline silicon layer 4. Vt adjust implants are then provided.

Next, the edges or sidewalls 23 of the silicon nitride layers 6 are recessed or pulled back from the overlying top silicon oxide layer 22 using for example a phosphoric etch composition. This etching procedure is extremely well controlled and readily can be used to determine the exact amount by which the top oxide layer 22 overhangs the silicon nitride 6.

The sacrificial oxide layer is then stripped such as by using a wet dip etching. A gate insulator layer 12 is formed such as a silicon dioxide by thermal oxidation of the underlying silicon layer 4. The gate insulator layer 12 is typically about 25 to about 100 Å thick and more typically about 30 to about 80 Å thick. See FIG. 9.

Figure 10:
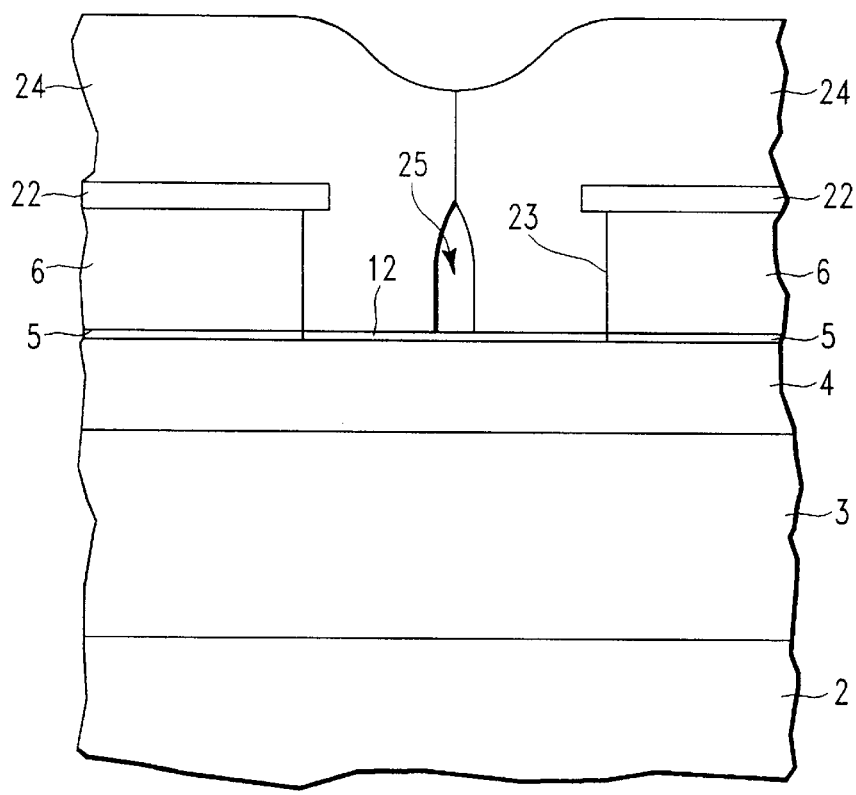

As illustrated in FIG. 10, an undoped polysilicon layer 24 is deposited such that the polysilicon 24 completely fills the opening 10 in the pad layers. However, because of the deposition process and the fact that the top silicon oxide 22 overhangs a portion of the pad silicon nitride 6, a void 25 is created in the polysilicon 24. This void 25 will be midway between what will later become the edges of the gate conductor.

Figure 11:
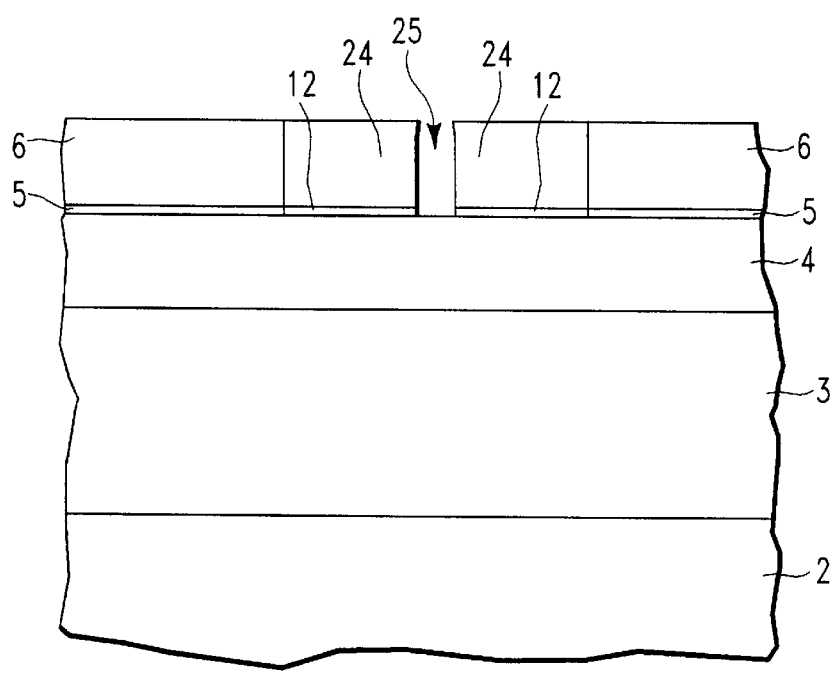

Next, the polysilicon 24 is planarized and polished down using CMP polishing so that the polysilicon 24 and silicon nitride 6 are coplanar as illustrated in FIG. 11. This polishing process removes the top silicon oxide layer and a portion of the silicon nitride layer. In addition, as illustrated in FIG. 11, this process exposes the void 25 in the polysilicon 24.

Next, the gate insulator 12 at the bottom of the void 25 is etched away using a fluorine based etch such as buffered HF and thereby exposing the top of the silicon layer 4.

Figure 12:
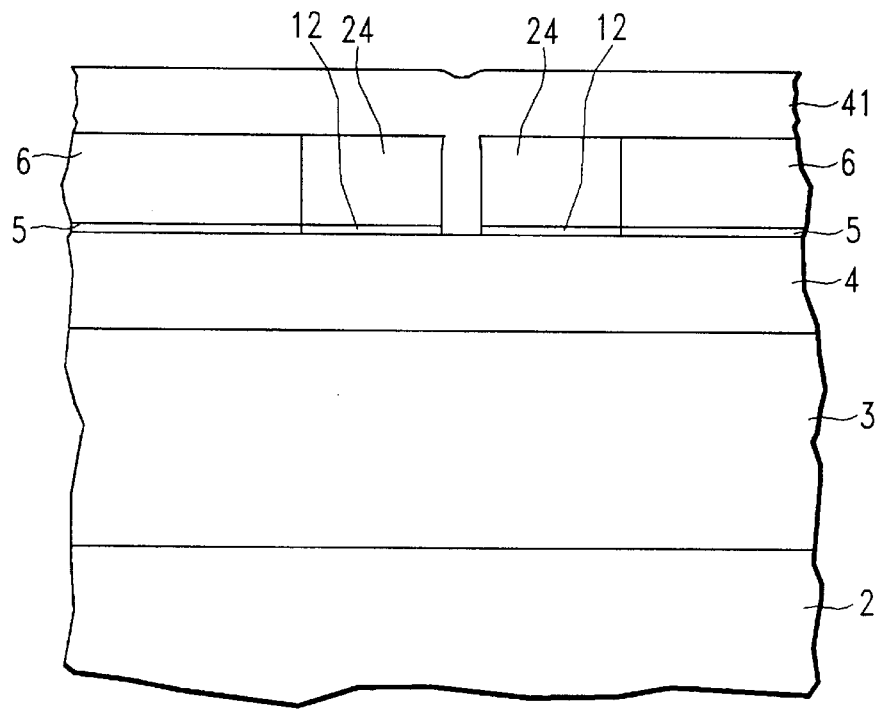

A layer 41 of a silicide forming metal such as titanium, tungsten, niobium, tantalum, molybdenum, zirconium, hafnium, vanadium and chromium is blanket deposited over the entire structure completely filling the gap or void 25 in the polysilicon 24 as illustrated in FIG. 12.

Figure 13:
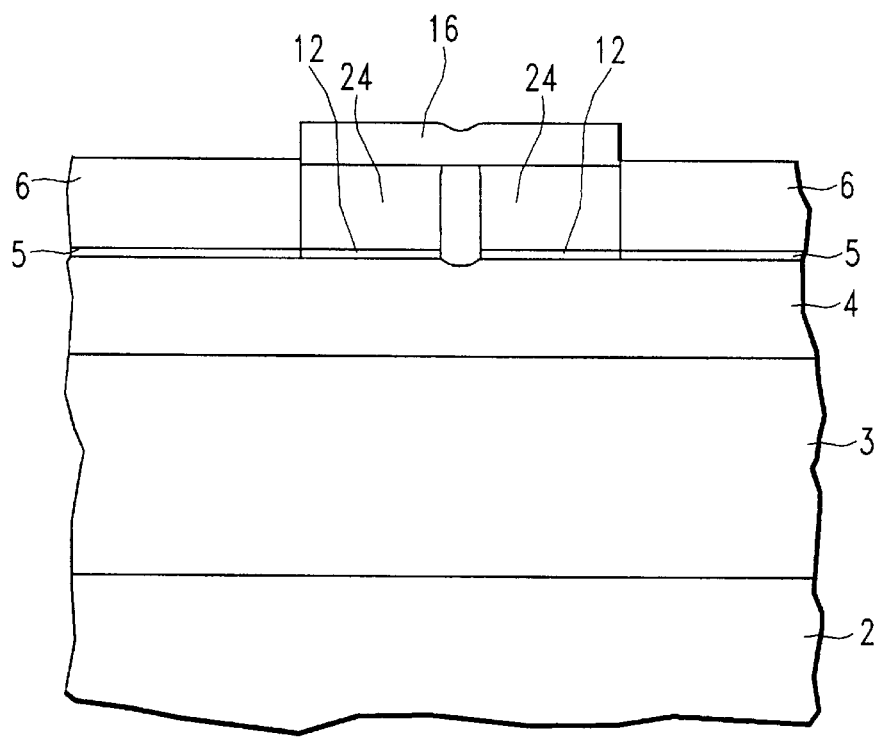
Figure 14:
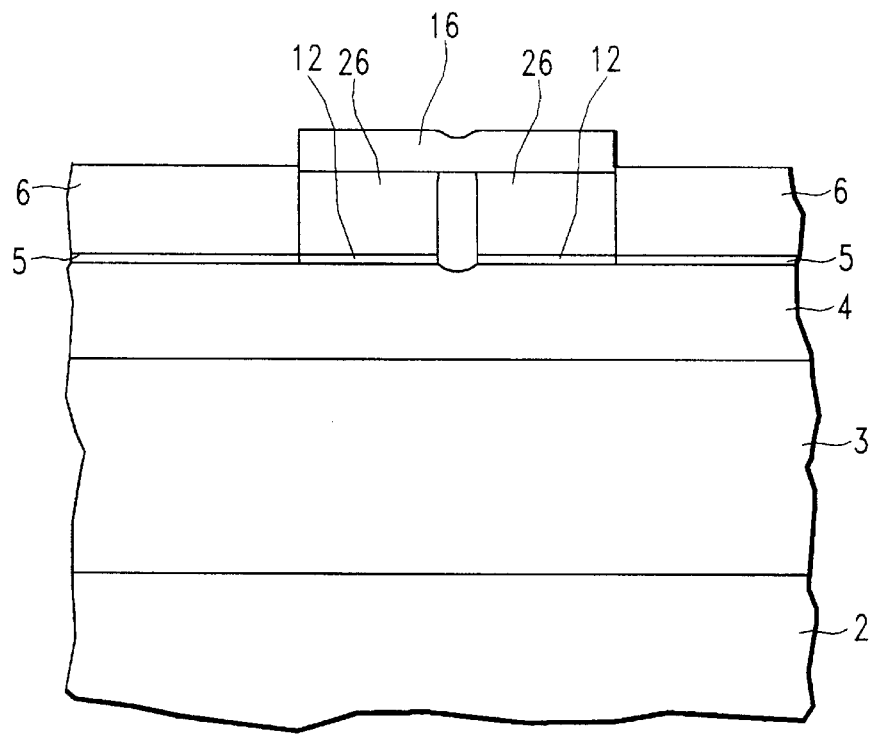
Figure 15:
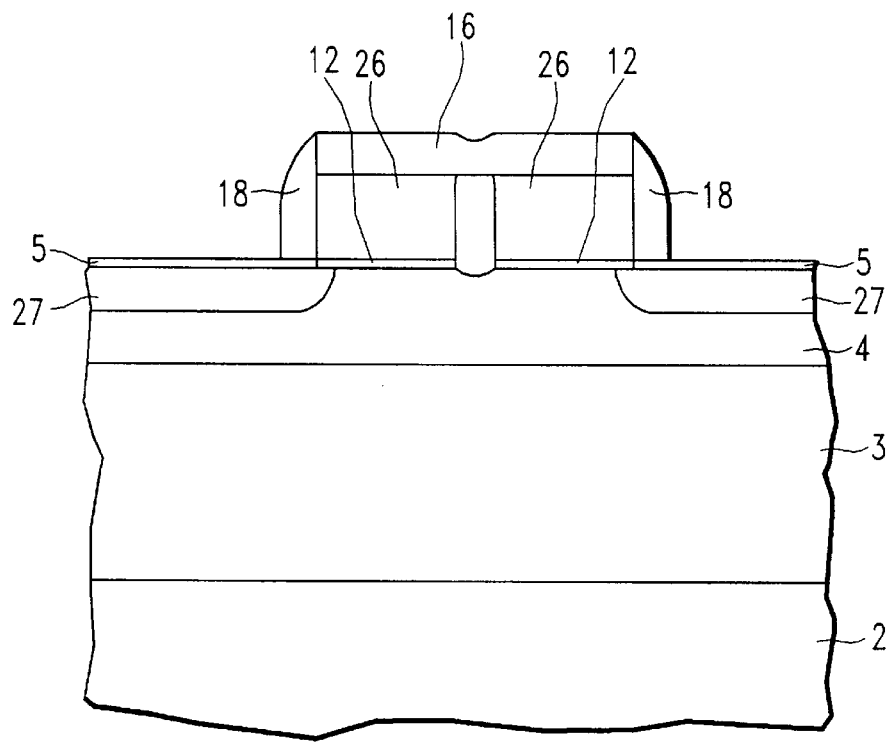
Figure 16:
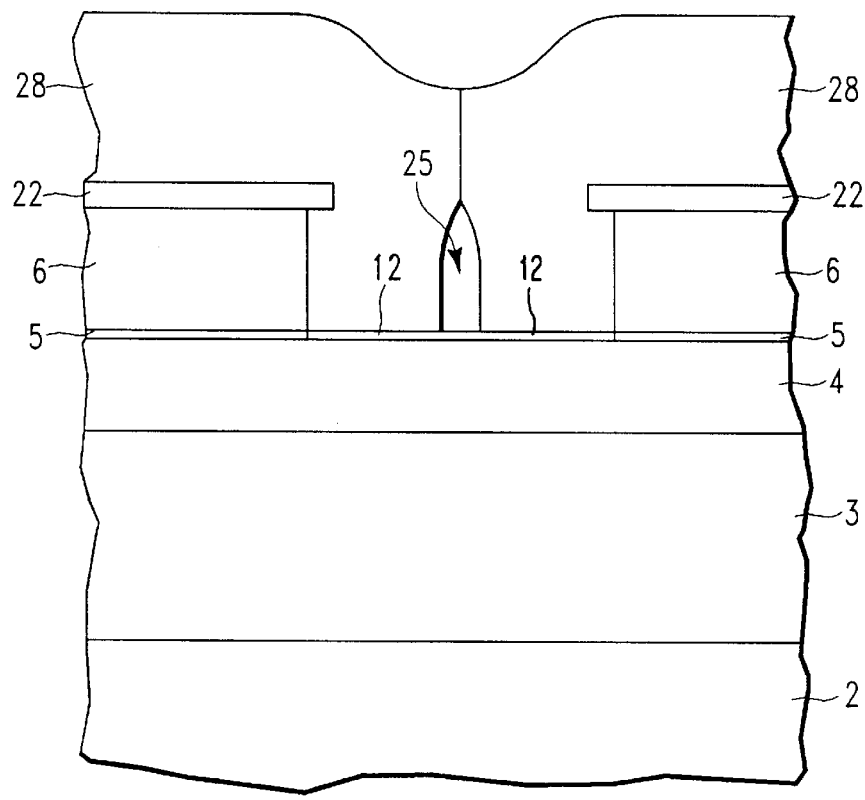
FIGS. 16–23 are schematic diagrams of the structure in various stages of the processing according to a further alternative embodiment of the present invention.
Figure 17:
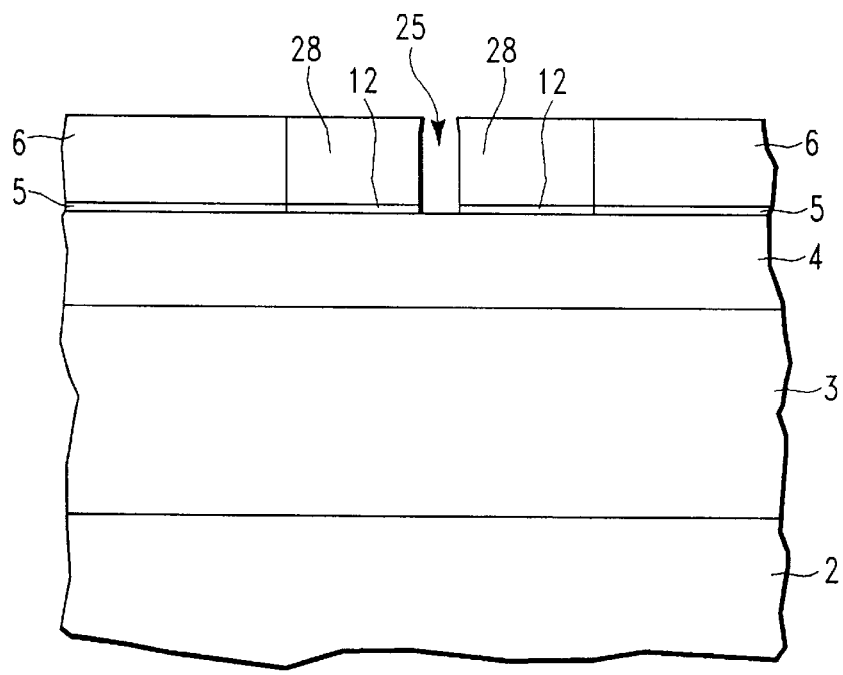
Figure 18:
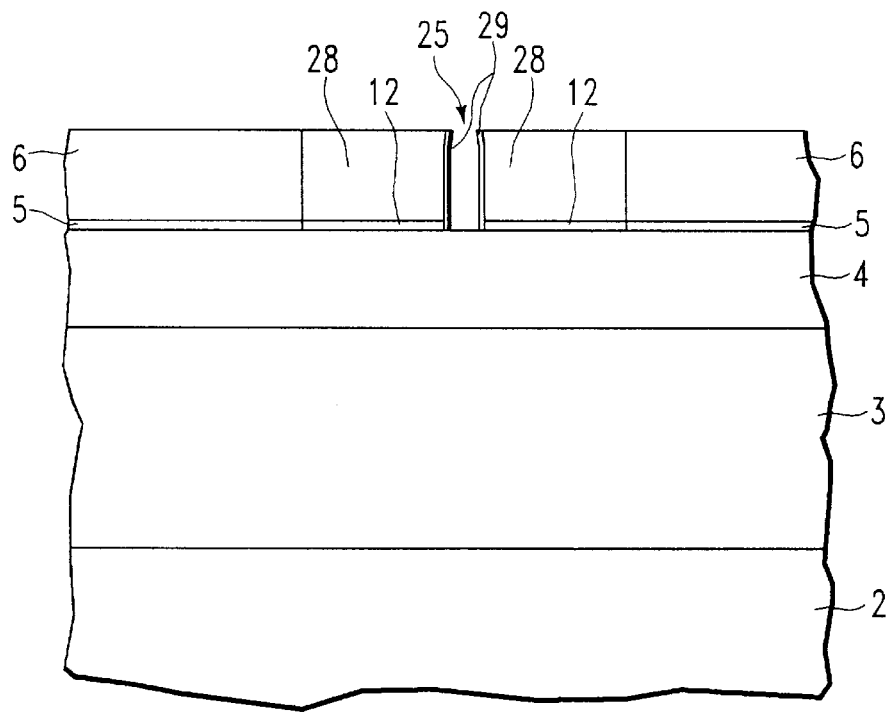
Figure 19:
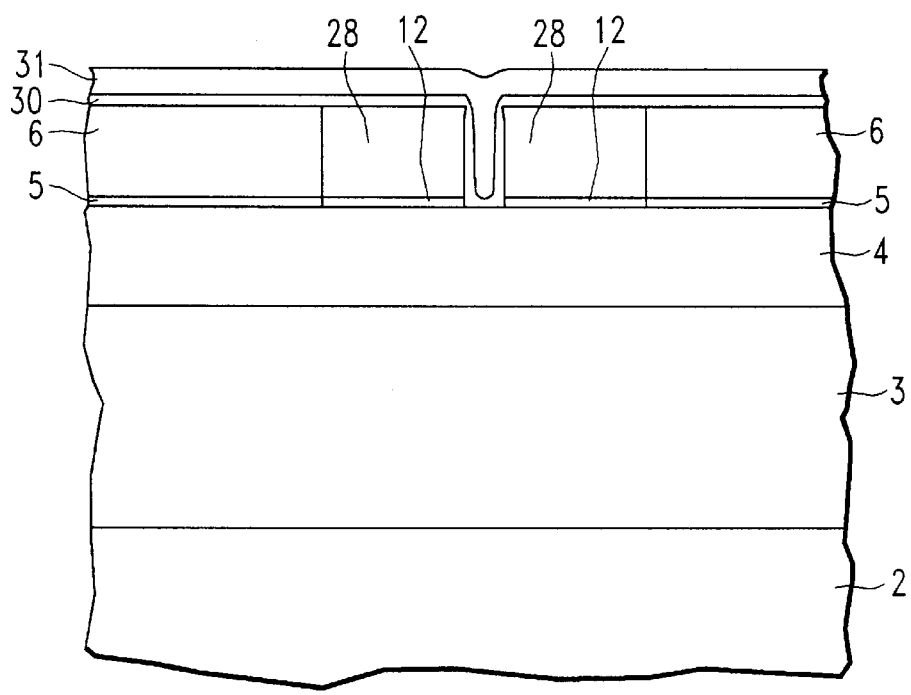
Figure 20:
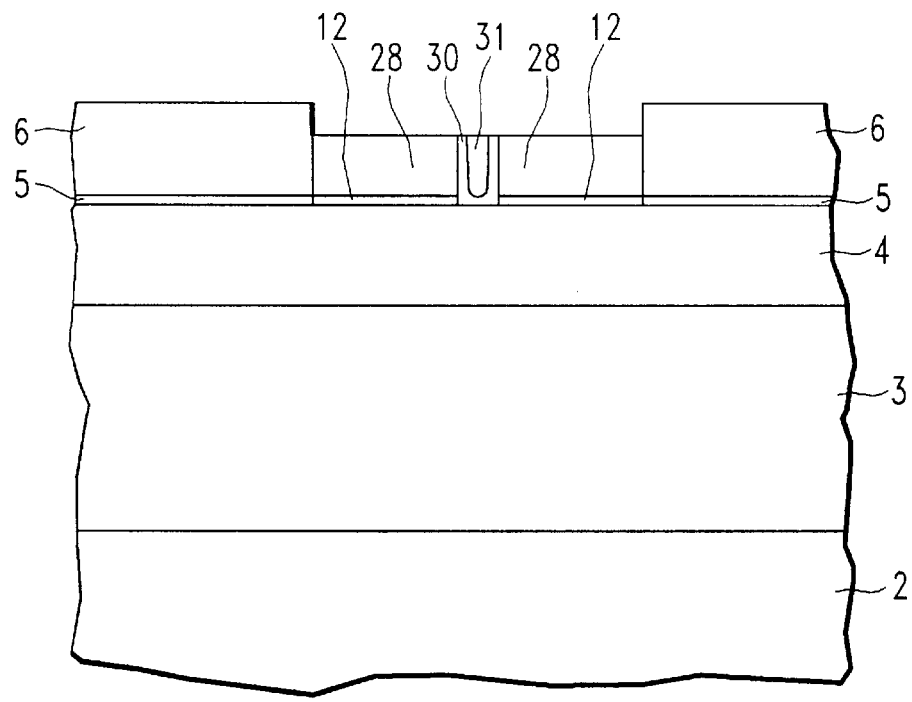
Figure 21:
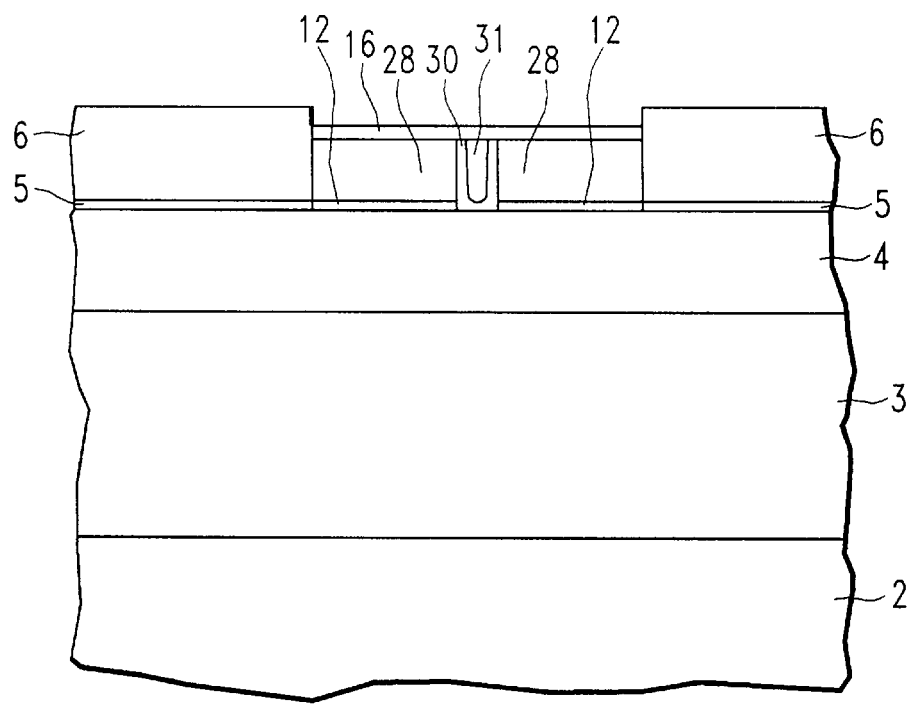
Figure 22:
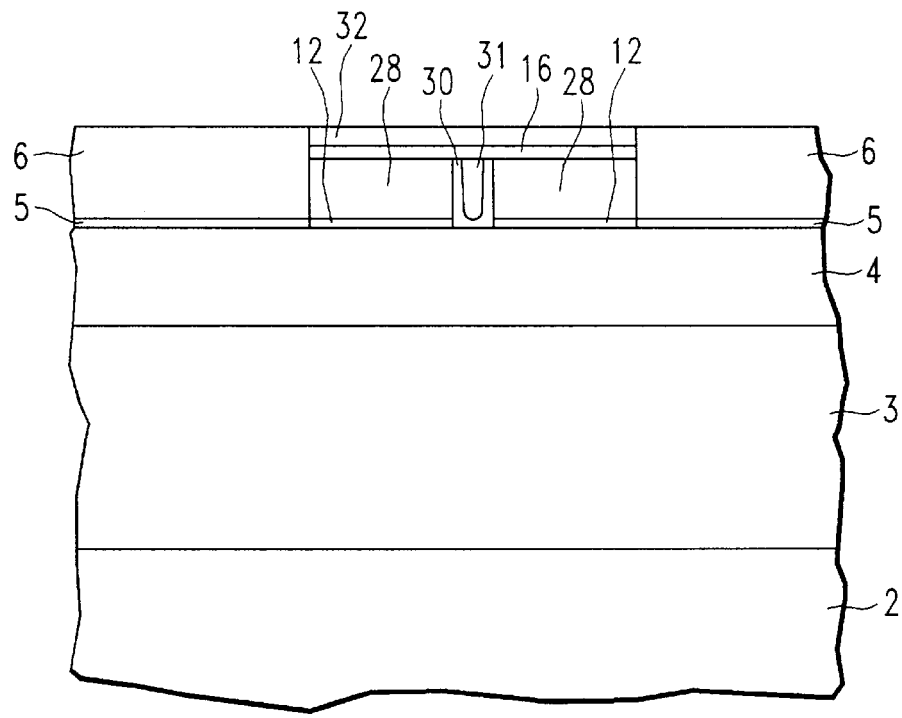
Figure 23:
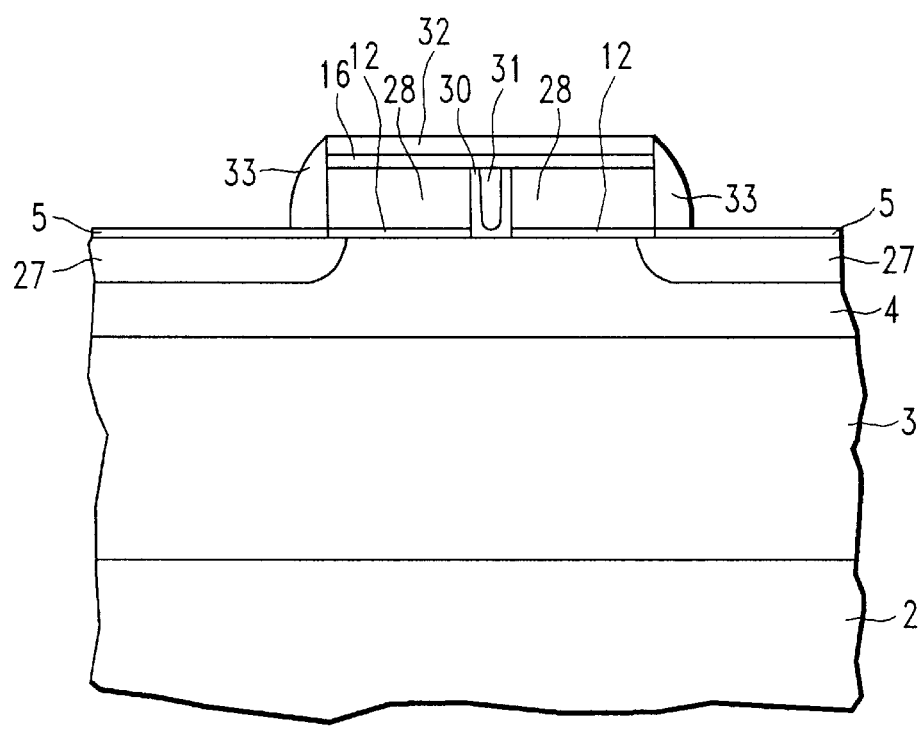

The metal such as titanium is then reacted to form a metallic silicide 16 over the polysilicon by reacting with the polysilicon with which it contacts (see FIG. 13). In the case of titanium, such can be reacted in an inert ambient such as argon. The unreacted metal such as titanium over the silicon nitride layer can be removed using an etchant selective to the titanium silicide. A particular example being a combination of sulfuric acid and hydrogen peroxide.

In addition, any minor or thin layer of titanium nitride that might have formed over the nitride may also be readily removed with this etchant composition without consuming any significant amount of the titanium silicide. This then provides a structure whereby the gate polysilicon is capped with a low resistivity metal which also contacts the gate conductor to the body of the SOI MOSFET.

The gate polysilicon can then be implanted through the silicide with either an N+- or P+-type impurity 26 to set a work function of the gate conductor suitable for the particular type of device desired. See FIG. 14. Because of rapid diffusivity in polysilicon, it is only necessary that the gate implant reach the top portion of the gate polysilicon. This makes it less likely that the channel region will be counterdoped. The thickness of the silicide layer may be formed such that the gate doping implant may also be used to form source/drain diffusions through the silicon nitride layer without counterdoping the channel region. Typical thicknesses of the silicide layer is about 100 to about 600 Å thick and more typically about 200 to about 500 Å thick. The depth of the source/drain junctions is limited by the silicon film thickness thus making the straggle a less critical issue.

The silicon nitride layer 6 can then be removed using a selective etchant to the gate conductors and sidewall spacers as well known. If desired, at this particular point, the source/drain implants 27 can be carried out (see FIG. 15). Moreover, in the event a previous low doping density source/drain procedure was carried out through the silicon nitride, it might be desirable at this point to carry out an additional higher concentration source/drain implant.

In addition, if desired instead of implanting the gate polysilicon when the nitride is still present, such implantation can be carried out after the silicon nitride is removed and both the polysilicon and source/drain regions can be doped at the same time.

Following this, conventional middle of the line (MOL) and back end of the line (BEOL) processing can be carried out as well known in the art.

In a still further embodiment, the processing can be carried out in the same manner as shown in FIGS. 8–15 up until the point where the void is exposed and the gate insulator at the bottom of the void is etched out as shown in FIG. 11, except that a polysilicon 28 doped with impurities of a first type (e.g. N+) is used in place of undoped polysilicon 24. See FIGS. 16 and 17.

At this stage (see FIG. 18), a diffusion barrier layer 29 may optionally be formed on the sidewalls of the void 25 by depositing a thin layer of material followed by reactive ion etching leaving only the material remaining on the sidewalls. Suitable diffusion barrier layers include conductive materials such as titanium nitride and tantalum silicon nitride, TaSiN, or an insulating material such as silicon nitride. This diffusion barrier layer is typically about 20 to about 50 Å thick and more typically about 30 to about 40 Å thick.

A thin layer 30 of a second polysilicon doped with impurities of a second type is then deposited such as by a low-temperature epi process. See FIG. 19. This layer is about 20 to about 50 Å thick and more typically about 30 to about 40 Å thick. Next, a third layer 31 of polysilicon doped with a high concentration of impurities of a second type is then deposited. This layer is typically about 100 to about 500 Å thick and more typically about 200 to about 400 Å thick. A low temperature epi deposition process is used in order to minimize interdiffusion of the second-type impurity doped polysilicon with the first-type impurity doped polysilicon. However, if the optional diffusion barrier layer is used, higher deposition temperatures may be employed since the diffusion barrier material ensures against this interdiffusion. The dopant level in layer 31 is greater than that of layer 30. Typically, the concentration of dopant for layer 30 is about $5 \times 10^{15}$ to about $5 \times 10^{17}$ cm$^3$ and that for layer 31 about $5 \times 10^{19}$ to about $1 \times 10^{21}$ cm$^{-3}$.

Next, the polysilicon is planarized to the top of the silicon nitride pad 6 and is then recessed a desired distance below it. See FIG. 20. Such can be carried out by reactive ion etching.

A layer of a silicide forming metal such as any of the metals disclosed above and preferably tungsten, titanium or niobium is deposited over the surface and then reacted with the exposed polysilicon with which it contacts to form a silicide layer. Typically this silicide layer is about 100 to about 1000 Å thick and more typically it is about 300 to about 600 Å thick.

The unreacted metal over the nitride is then removed by a selective etching process to the silicide. In the case of titanium, such etchant comprises a combination of sulfuric acid and hydrogen peroxide. See FIG. 21.

A silicon oxide cap layer 32 such as chemical vapor deposited silicon oxide is deposited and planarized to the top of the silicon nitride pad layer. This forms an insulating cap over the gate conductor. This is carried out when a borderless contact to diffusion is desired.

Next, the nitride pad is removed and source/drain implants 27 is carried out. Gate sidewall insulating spacers 33 can be formed. See FIG. 23. The device can then be subjected to conventional processing to form the desired structure as well known in the art.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An active FET body device which comprises an active FET region including a gate; a channel region and electrical connection between said gate and said channel region located within said active FET region, wherein the electrical connection extends over substantially the entire width of the FET.

2. The active FET body device of claim 1 comprising a SOI substrate.

3. The device of claim 1 wherein said connection between said gate and said channel region is self-aligned to edges of the gate.

4. The device of claim 2 being a SOI DRAM array device, logic device or driver device.

5. The active FET body device of claim 1 wherein a metallic silicide and silicon oxide structure are located on top of said gate to act as a cap for said gate.

6. The active FET body device according to claim 1 wherein said gate is doped polysilicon.

7. The active FET body device of claim 1 wherein the length of the electrical connection between the gate and channel region along a surface of the FET is about 200 Å or less.

8. The active FET body device of claim 1 wherein the length of the electrical connection between the gate and channel region along a surface of the FET is about 100 Å or less.

* * * * *